United States Patent
Kakimoto

(10) Patent No.: US 9,490,122 B2
(45) Date of Patent: Nov. 8, 2016

(54) METHOD AND APPARATUS OF FORMING CARBON-CONTAINING SILICON FILM

(71) Applicant: TOKYO ELECTRON LIMITED, Tokyo (JP)

(72) Inventor: Akinobu Kakimoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/629,666

(22) Filed: Feb. 24, 2015

(65) Prior Publication Data

US 2015/0243496 A1 Aug. 27, 2015

(30) Foreign Application Priority Data

Feb. 25, 2014 (JP) ................. 2014-033686

(51) Int. Cl.
| | |
|---|---|
| H01L 21/02 | (2006.01) |
| C23C 16/52 | (2006.01) |
| C23C 16/30 | (2006.01) |
| C23C 16/32 | (2006.01) |
| C23C 16/455 | (2006.01) |

(52) U.S. Cl.
CPC .......... *H01L 21/0262* (2013.01); *C23C 16/30* (2013.01); *C23C 16/325* (2013.01); *C23C 16/4554* (2013.01); *C23C 16/45531* (2013.01); *C23C 16/45546* (2013.01); *C23C 16/52* (2013.01); *H01L 21/02529* (2013.01); *H01L 21/02579* (2013.01)

(58) Field of Classification Search
CPC ...................................... H01L 21/02
USPC ................................. 438/507, 758
See application file for complete search history.

(56) References Cited

U.S. PATENT DOCUMENTS

| | | | |
|---|---|---|---|
| 6,117,233 A | 9/2000 | Bill et al. | |
| 2012/0000490 A1* | 1/2012 | Chung et al. | B08B 7/0035 134/22.12 |
| 2012/0177841 A1 | 7/2012 | Thompson | |

FOREIGN PATENT DOCUMENTS

| | | |
|---|---|---|
| JP | 06041750 A | 2/1994 |
| JP | 2008123213 A | 5/2008 |
| JP | 2010533633 A | 10/2010 |
| JP | 2013524516 A | 6/2013 |

* cited by examiner

*Primary Examiner* — Whitney T Moore
*Assistant Examiner* — Rodolfo D Fortich
(74) *Attorney, Agent, or Firm* — Nath, Goldberg & Meyer; Jerald L. Meyer

(57) ABSTRACT

A method of forming a carbon-containing silicon film includes: adsorbing a silicon source on a workpiece by supplying a silicon source gas containing at least one chlorine group into a reaction chamber accommodating the workpiece and activating the supplied silicon source gas to react the activated silicon source gas with the workpiece; and removing chlorine from the adsorbed silicon source containing chlorine by supplying an alkyl metal gas into the reaction chamber and activating the supplied alkyl metal gas to react the activated alkyl metal gas with the adsorbed silicon source. Adsorbing a silicon source and removing chlorine are sequentially repeated plural times.

6 Claims, 8 Drawing Sheets

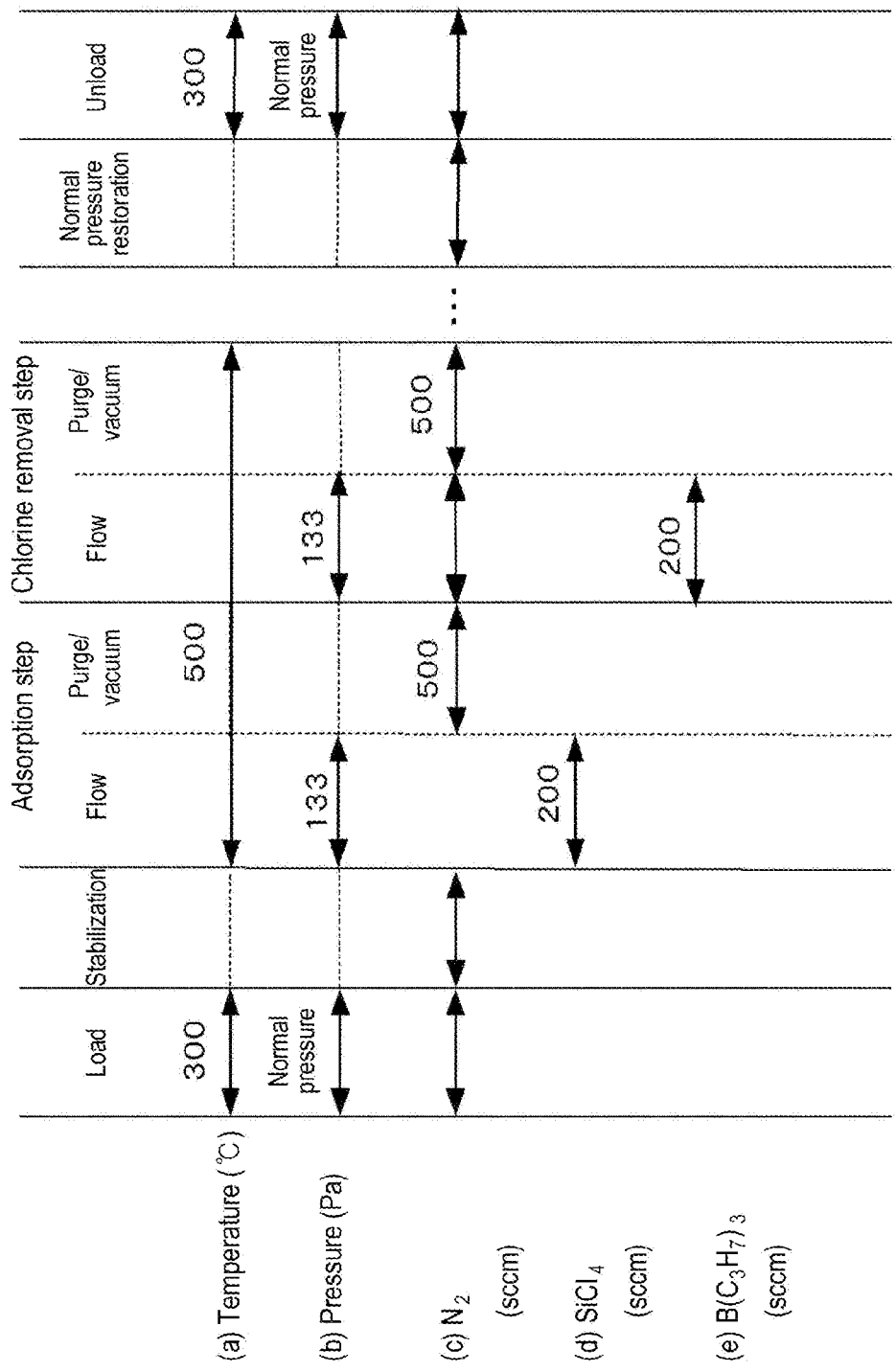

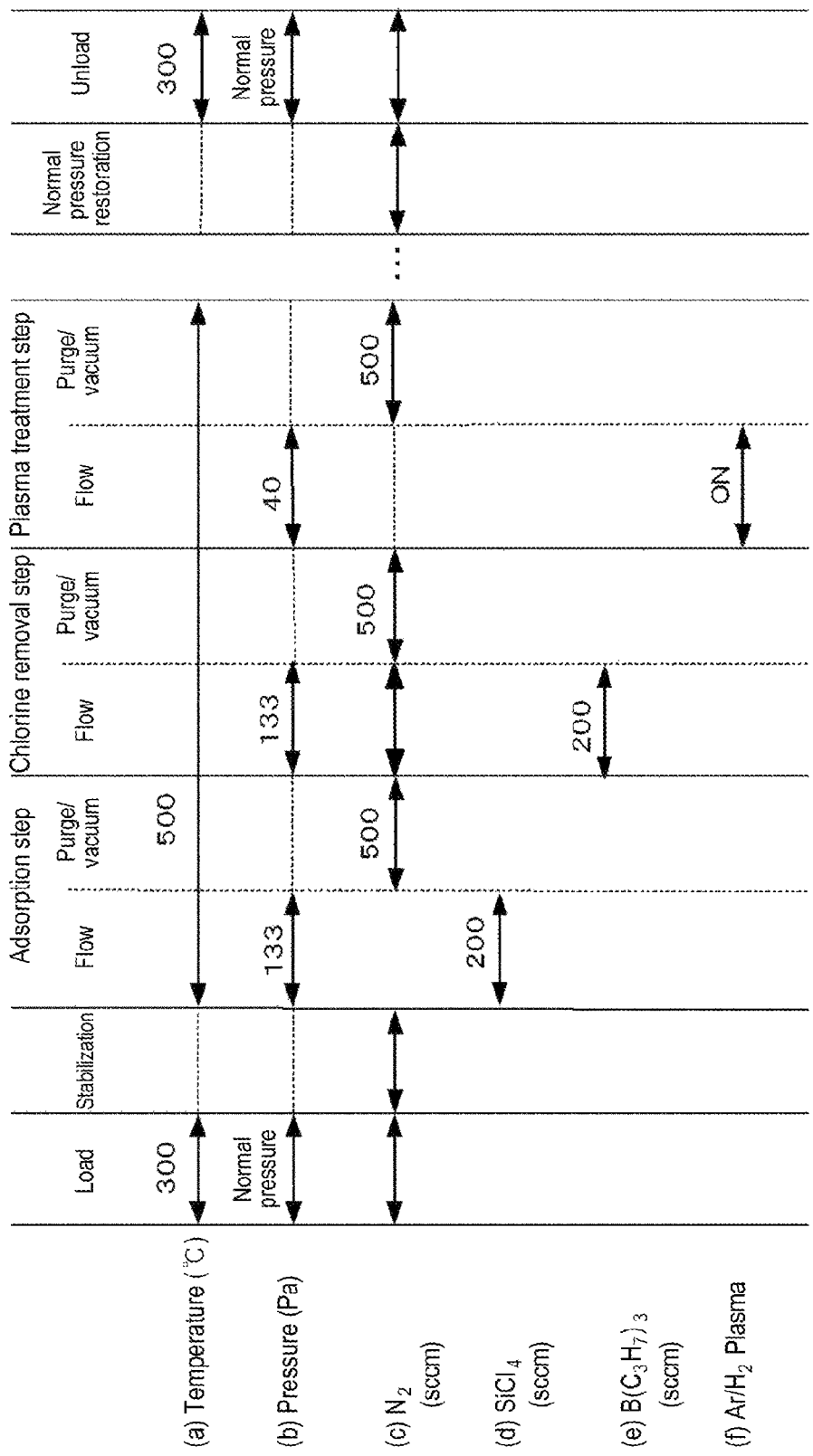

METHOD AND APPARATUS OF FORMING CARBON-CONTAINING SILICON FILM

CROSS-REFERENCE TO RELATED APPLICATION

This application claims the benefit of Japanese Patent Application No. 2014-033686, filed on Feb. 25, 2014, in the Japan Patent Office, the disclosure of which is incorporated herein in its entirety by reference.

TECHNICAL FIELD

The present disclosure relates to a method and apparatus of forming a carbon-containing silicon film.

BACKGROUND

As a method of forming a carbon-containing silicon film, for example, a silicon carbide (SiC) film, there is proposed, for example, an atomic layer deposition (ALD) method capable of forming a SiC film by alternately supplying tetrachlorosilane ($SiCl_4$) and trimethyl aluminum ($Al(CH_3)_3$) to a workpiece.

However, the SiC film formed by the ALD method has a problem in that large amounts of impurities (Al) are left in the film. Therefore, there is a need for a method of forming a carbon-containing silicon film having low impurity content.

SUMMARY

The present disclosure provides a method and apparatus of forming a carbon-containing silicon film having low impurity content.

According to one embodiment of the present disclosure, a method of forming a carbon-containing silicon film, includes: adsorbing a silicon source on a workpiece by supplying a silicon source gas containing at least one chlorine group into a reaction chamber accommodating the workpiece and activating the supplied silicon source gas to react the activated silicon source gas with the workpiece; and removing chlorine from the adsorbed silicon source containing chlorine by supplying an alkyl metal gas into the reaction chamber and activating the supplied alkyl metal gas to react the activated alkyl metal gas with the adsorbed silicon source. Adsorbing a silicon source and removing chlorine are sequentially repeated plural times.

According to another embodiment of the present disclosure, a apparatus of forming a carbon-containing silicon film, includes: a reaction chamber accommodating a workpiece; a silicon source gas supply unit configured to supply a silicon source gas containing at least one chlorine group into the reaction chamber; an alkyl metal gas supply unit configured to supply an alkyl metal gas into the reaction chamber; and a controller configured to control the silicon source gas supply unit and the alkyl metal gas supply unit. The controller repeats a process plural times, the process including: controlling the silicon source gas supply unit such that the silicon source gas is supplied into the reaction chamber to adsorb the silicon source on the workpiece accommodated in the reaction chamber, and controlling the alkyl metal gas supply unit such that the alkyl metal gas is supplied into the reaction chamber to remove chlorine from the adsorbed silicon source.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a view explaining a method of forming a SiC film according to one embodiment of the present disclosure.

FIG. 5 is a view explaining a method of forming a SiC film according to another embodiment of the present disclosure.

DETAILED DESCRIPTION

Figure 1:
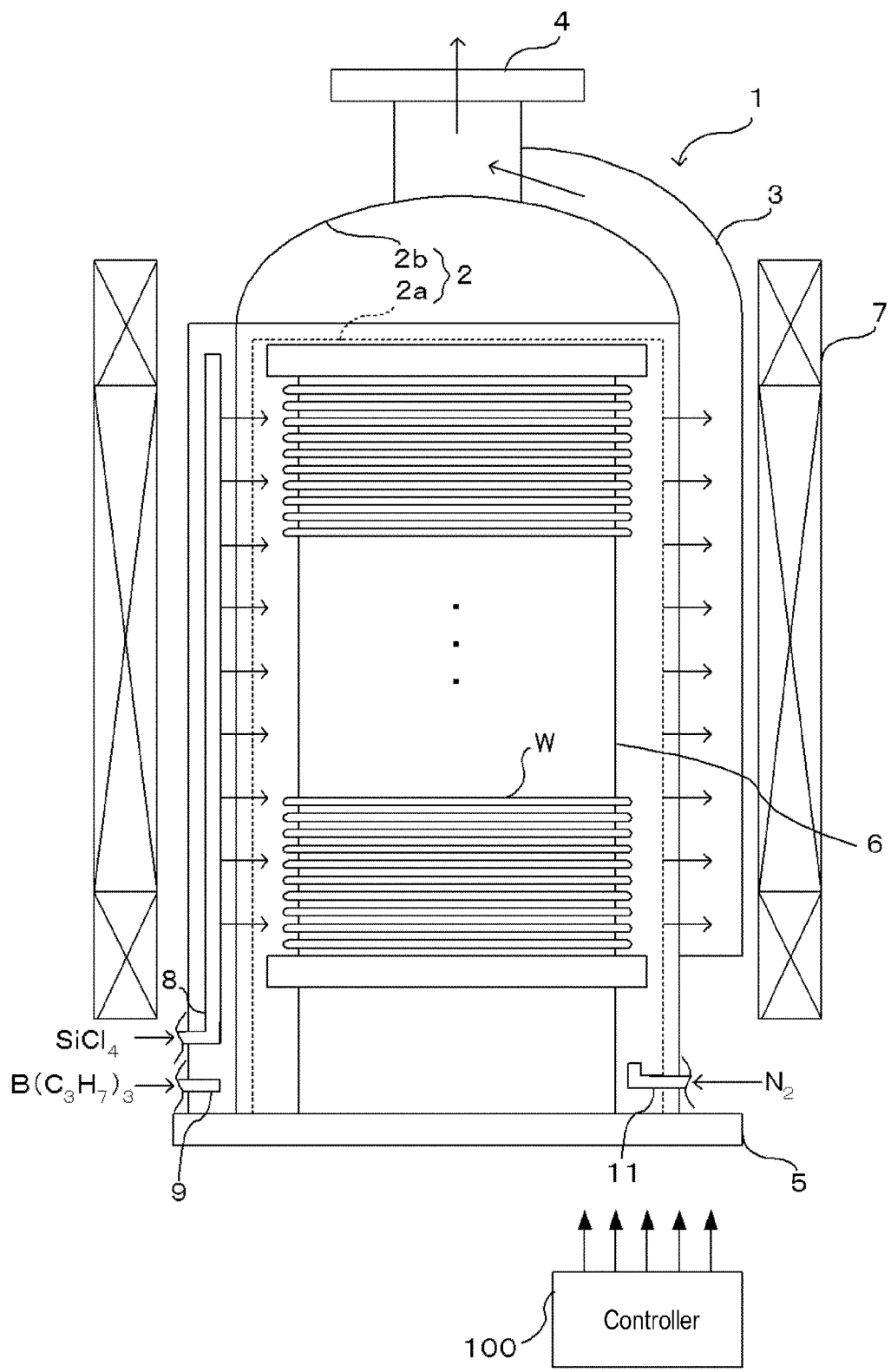
FIG. 1 illustrates a processing apparatus according to one embodiment of the present disclosure.

A method and apparatus of forming a carbon-containing silicon film according to some embodiments of the present disclosure will now be described in detail. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. In these embodiments, description will be given by way of an example where a method and apparatus of forming a silicon carbide film (SiC film) are intended as the method and apparatus of forming a carbon-containing silicon film. In addition, the description will be given by way of an example where a batch-type vertical processing apparatus is used as the apparatus for forming a SiC film. FIG. 1 illustrates the configuration of the processing apparatus according to one embodiment.

As shown in FIG. 1, the processing apparatus 1 includes a reaction tube 2, a longitudinal direction of which extends in the vertical direction. The reaction tube 2 has a double tube structure which includes an inner tube 2a and a roofed outer tube 2b configured to cover the inner tube 2a and is separated a predetermined distance from the inner tube 2a. Sidewalls of the inner tube 2a and the outer tube 2b have a plurality of openings as indicated by arrows in FIG. 1. The inner tube 2a and the outer tube 2b are made of a material having excellent properties in terms of heat resistance and corrosion resistance, for example, quartz.

The reaction tube 2 is provided at one side thereof with an exhaust unit 3 that exhausts gas from the reaction tube 2. The exhaust unit 3 extends upward along the reaction tube 2 and communicates with the reaction tube 2 through the openings formed in the sidewall of the reaction tube 2. The exhaust unit 3 is connected at an upper end thereof to an exhaust port 4 arranged at an upper portion of the reaction tube 2. An exhaust pipe (not shown) is connected to the exhaust port 4. Pressure regulating mechanisms such as a valve (not shown) and a vacuum pump 127 described below are disposed in the exhaust pipe. By virtue of the pressure regulating mechanisms, a gas supplied from one side of the sidewall of the outer tube 2b (a source gas supply pipe 8) is exhausted to the exhaust pipe through the inner tube 2a, the other side sidewall of the outer tube 2b, the exhaust unit 3, and the exhaust port 4. Thus, the interior of the reaction tube 2 is controlled to a desired pressure (vacuum degree).

A lid 5 is disposed below the reaction tube 2. The lid 5 is made of a material having excellent properties in terms of heat resistance and corrosion resistance, for example, quartz. The lid 5 is configured to be movable up and down by a boat elevator 128 described below. When the lid 5 is moved up by the boat elevator 128, a lower end (furnace port) of the reaction tube 2 is closed. When the lid 5 is moved down by the boat elevator 128, the lower end (furnace port) of the reaction tube 2 is opened.

A wafer boat 6 is mounted on the lid 5. The wafer boat 6 is made of, for example, quartz. The wafer boat 6 is configured to accommodate a plurality of semiconductor wafers W such that the semiconductor wafers W are separated a predetermined distance from each other in the vertical direction. Furthermore, a heat insulating container which prevents reduction in internal temperature of the reaction tube 2 from the furnace port of the reaction tube 2 or a rotary table on which the wafer boat 6 for accommodating the semiconductor wafers W may be rotatably mounted may be disposed on the lid 5. The wafer boat 6 may be mounted on the heat insulating container or the rotary table. In this case, it is easy to uniformly control the temperature of the semiconductor wafers W accommodated within the wafer boat 6.

In the vicinity of the reaction tube 2, heaters 7 for temperature elevation formed of, for example, resistive heating elements, are disposed so as to surround the reaction tube 2. The interior of the reaction tube 2 is heated to a predetermined temperature by the heaters 7. As a result, the semiconductor wafers W accommodated within the reaction tube 2 are heated to a predetermined temperature.

The source gas supply pipe 8 for supplying a source gas into the reaction tube 2 (the outer tube 2b) is inserted into the reaction tube 2 through a side surface near the lower end of the reaction tube 2. The source gas is a Si source for adsorbing a source (Si) to a workpiece. The source gas is used in an adsorption step described below. Examples of the Si source may include a silicon source containing at least one chlorine group, for example, dichlorosilane ($SiH_2Cl_2$), trichlorosilane ($SiHCl_3$), monochlorosilane ($SiH_3Cl$), tetrachlorosilane ($SiCl_4$), hexachlorodisilane ($Si_2Cl_6$), and octachlorotrisilane ($Si_3Cl_8$). In this example, tetrachlorosilane is used as the Si source.

A plurality of supply holes is formed in the source gas supply pipe 8 to be arranged at predetermined intervals in the vertical direction. The source gas is supplied into the reaction tube 2 (the outer tube 2b) through the supply holes. Thus, as indicated by arrows in FIG. 1, the source gas is supplied into the reaction tube 2 from a plurality of places arranged in the vertical direction.

Moreover, an alkyl metal supply pipe 9 for supplying an alkyl metal into the reaction tube 2 (the outer tube 2b) is inserted into the reaction tube 2 through the side surface near the lower end of the reaction tube 2. As used herein, the alkyl metal refers to a compound in which metal is bonded to an alkyl group. For example, when the metal is boron (B), the examples of the alkyl metal may include trimethyl boron ($B(CH_3)_3$), triethyl boron ($B(C_2H_5)_3$), tripropyl boron ($B(C_3H_7)_3$), and triisopropyl boron ($B(C_3H_7)_3$). The alkyl metal is used in a chlorine removal step for substituting alkyl groups for chlorine of the adsorbed source, as described below. In this example, triisopropyl boron is used as the alkyl metal.

Furthermore, a nitrogen gas supply pipe 11 for supplying nitrogen ($N_2$) as a diluting gas and a purge gas into the reaction tube 2 (the outer tube 2b) is inserted into the reaction tube 2 through the side surface near the lower end of the reaction tube 2.

The source gas supply pipe 8, the alkyl metal supply pipe 9, and the nitrogen gas supply pipe 11 are connected to gas supply sources (not shown) through a mass flow controllers (MFC) 125 described below.

Moreover, a plurality of temperature sensors 122, for example, thermocouples, for measuring the internal temperature of the reaction tube 2 and a plurality of pressure gauges 123 for measuring the internal pressure of the reaction tube 2 are disposed within the reaction tube 2.

Figure 2:
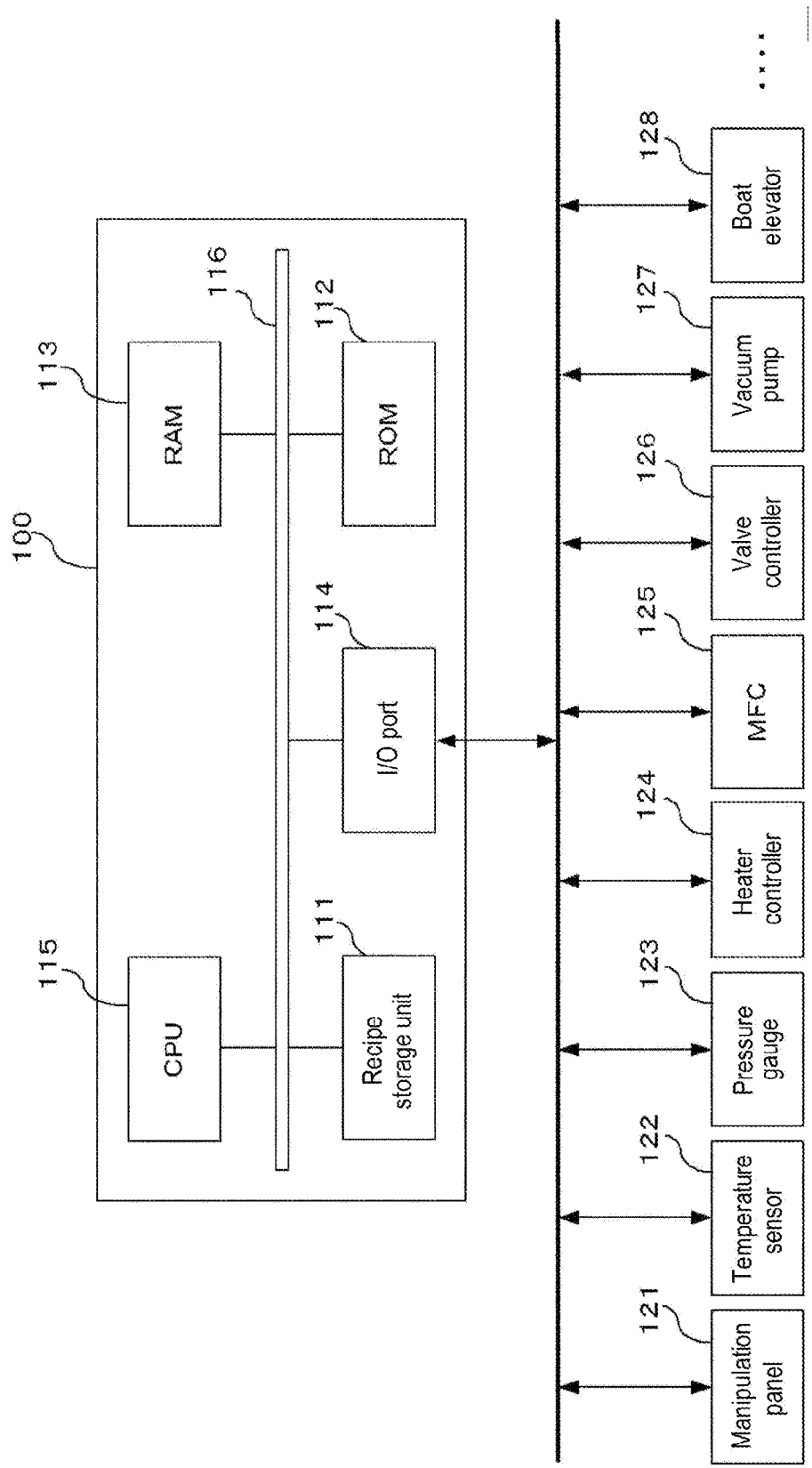
FIG. 2 is a diagram showing a configuration of a controller shown in FIG. 1.

Furthermore, the processing apparatus 1 includes a controller 100 configured to control the respective components of the apparatus. FIG. 2 illustrates the configuration of the controller 100. As shown in FIG. 2, a manipulation panel 121, the temperature sensors 122, the pressure gauges 123, a heater controller 124, the MFC 125, valve controllers 126, the vacuum pump 127, the boat elevator 128 and the like are connected to the controller 100.

The manipulation panel 121 includes a display screen and operation buttons. The manipulation panel 121 transmits operation instructions of an operator to the controller 100 and displays various types of information received from the controller 100 on the display screen.

The temperature sensors 122 measure the temperatures of the respective components within the reaction tube 2 and the exhaust pipe, and notify the measurement to the controller 100.

The pressure gauges 123 measure the pressures of the respective components within the reaction tube 2 and the exhaust pipe, and notify the measurement to the controller 100.

The heater controller 124 individually controls the heaters 7. In response to instructions received from the controller 100, the heater controller 124 allows supply of electric current to the heaters 7 to start the heaters 7. Moreover, the heater controller 124 individually measures power consumption of the heaters 7 and notifies the measurement to the controller 100.

The MFC 125 is disposed in each pipe of the source gas supply pipe 8, the alkyl metal supply pipe 9, and the nitrogen gas supply pipe 11. The MFC 125 controls flow rates of gases flowing through the respective pipes in amounts specified from the controller 100. In addition, the MFC 125 measures the flow rates of the actually flowing gases and notifies the measurement to the controller 100.

The valve controllers 126 are disposed in the respective pipes and control a degree of opening of the valves disposed in the respective pipes as the values specified from the controller 100.

The vacuum pump 127 is connected to the exhaust pipe and exhausts the gas present within the reaction tube 2.

The boat elevator 128 moves the lid 5 upward to load the wafer boat 6 (the semiconductor wafers W) to the interior of the reaction tube 2. The boat elevator 128 moves the lid 5 downward to unload the wafer boat 6 (the semiconductor wafers W) from the interior of the reaction tube 2.

The controller 100 includes a recipe storage unit 111, a read only memory (ROM) 112, a random access memory (RAM) 113, an input/output (I/O) port 114, a central processing unit (CPU) 115, and a bus 116 interconnecting these components to one another.

A setup recipe and a plurality of process recipes are stored in the recipe storage unit 111. Only the setup recipe is stored when the processing apparatus 1 is initially fabricated. The setup recipe is performed when a thermal model and the like is generated according to each processing apparatus. The process recipe is prepared in each heat treatment (process) actually performed by a user. Each of the process recipes defines temperature changes of the respective components, pressure changes within the reaction tube 2, and supply start/stop timings and supply amounts of various types of gases, from the time when the semiconductor wafers W are loaded into the reaction tube 2 to the time when the processed semiconductor wafers W are unloaded from the reaction tube 2.

The ROM 112 is constituted by an electrically erasable programmable read only memory (EEPROM), a flash memory, a hard disk or the like. The ROM 112 is a recording medium that stores an operation program of the CPU 115.

The RAM 113 serves as a work area of the CPU 115.

The I/O port 114 is connected to the manipulation panel 121, the temperature sensors 122, the pressure gauges 123, the heater controller 124, the MFC 125, the valve controllers 126, the vacuum pump 127, the boat elevator 128, and the like. The I/O port 114 controls the input and output of data and signals.

The CPU 115 constitutes a center of the controller 100 and executes operation programs stored in the ROM 112. Moreover, the CPU 115 controls operation of the processing apparatus 1 depending on the recipes (process recipes) stored in the recipe storage unit 111 in accordance with the instructions from the manipulation panel 121. That is to say, the CPU 115 allows the temperature sensors 122, the pressure gauges 123, the MFC 125, and the like to measure the temperatures, pressures, and flow rates of the respective components within the reaction tube 2 and the exhaust pipe. Based on the measurement data, the CPU 115 outputs control signals to the heater controller 124, the MFC 125, the valve controllers 126, the vacuum pump 127, and the like, thereby controlling the respective components in accordance with the process recipes.

The bus 116 transmits information between the respective components.

Next, a method of forming a SiC film using the processing apparatus 1 configured as above will be described with reference to the recipe (time sequence) shown in FIG. 3. In the method of forming a SiC film according to this embodiment, a SiC film is formed on a semiconductor wafer W by ALD method.

In this embodiment, as shown in FIG. 3, an adsorption step for adsorbing a source (Si) to a semiconductor wafer W and a chlorine removal step for removing chlorine (Cl) from the adsorbed source are performed (repeated) plural times, for example, one hundred cycles, whereby a SiC film having a desired thickness is formed on the semiconductor wafer W. In addition, in this embodiment, as shown in FIG. 3, tetrachlorosilane ($SiCl_4$) is used as a Si source gas, triisopropyl boron ($B(C_3H_7)_3$) is used as the alkyl metal, and nitrogen ($N_2$) is used as the diluting gas.

Moreover, in the following description, operations of the respective components constituting the processing apparatus 1 are controlled by the controller 100 (the CPU 115). Furthermore, the controller 100 (the CPU 115) controls the heater controller 124 (the heaters 7), the MFC 125 (the source gas supply pipe 8, etc.), the valve controllers 126, and the vacuum pump 127 in the aforementioned manner, such that the temperature, the pressure and the flow rates of gases within the reaction tube 2 in the respective processes are set to conditions conforming to the recipe shown in FIG. 3.

First, the interior of the reaction tube 2 is maintained at a predetermined loading temperature, for example, 300 degrees C., by the heaters 7, as shown in (a) of FIG. 3. A specific amount of nitrogen is supplied from the nitrogen gas supply pipe 11 into the reaction tube 2, as shown in (c) of FIG. 3. Next, the wafer boat 6 accommodating the semiconductor wafers W is mounted on the lid 5. Then, the lid 5 is moved up by the boat elevator 128, thereby loading the semiconductor wafers W (the wafer boat 6) into the reaction tube 2 (load process).

First, the interior of the reaction tube 2 is set to a predetermined temperature, for example, 500 degrees C., as shown in (a) of FIG. 3, by the heaters 7. Moreover, the gas is discharged from the reaction tube 2 while a specific amount of nitrogen is supplied from the nitrogen gas supply pipe 11 into the reaction tube 2. Thus, the internal pressure of the reaction tube 2 is set to a predetermined pressure, for example, 133 Pa (1 Torr), as shown in (b) of FIG. 3 (stabilization process).

In this regard, in some embodiments, the internal temperature of the reaction tube 2 may range from 200 degrees C. to 600 degrees C., in another embodiment, from 350 degrees C. to 550 degrees C. If the internal temperature of the reaction tube 2 is set in this range, the SiC film can have further improved film quality and uniformity in terms of film thickness.

In some embodiments, the internal pressure of the reaction tube 2 may range from 0.133 Pa (0.001 Torr) to 13.3 kPa (100 Torr). If the internal pressure of the reaction tube 2 is set in this range, it is possible to accelerate reaction of Si with the semiconductor wafer W. In other embodiments, the internal pressure of the reaction tube 2 may range from 13.3 Pa (0.1 Torr) to 1330 Pa (10 Torr). If the internal pressure of the reaction tube 2 is set in this range, it is easy to control the internal pressure of the reaction tube 2.

Subsequently, the adsorption step for adsorbing Si to the semiconductor wafer W is performed. In the adsorption step, a specific amount, for example, 200 sccm of tetrachlorosilane ($SiCl_4$) is supplied as a Si source from the source gas supply pipe 8 into the reaction tube 2, as shown in (d) of FIG. 3 (flow process).

Figure 4A:
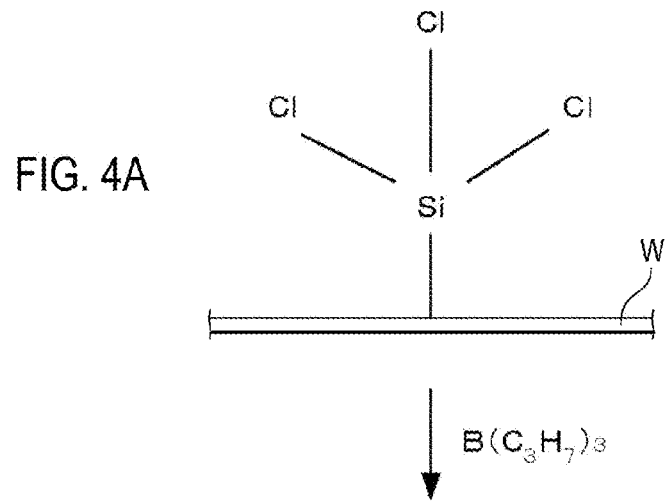
FIGS. 4A to 4C are a view explaining reaction at a surface of a semiconductor wafer.

$SiCl_4$ supplied into the reaction tube 2 is heated and activated within the reaction tube 2. For this reason, upon supplying $SiCl_4$ into the reaction tube 2, the activated Si reacts with the semiconductor wafer W and Si is adsorbed to the semiconductor wafer W, as shown in FIG. 4A.

When a predetermined amount of Si is adsorbed to the semiconductor wafer W, supply of $SiCl_4$ from the source gas supply pipe 8 is stopped. Then, while the gas within the reaction tube 2 is discharged, a specific amount, for example, 500 sccm of nitrogen is supplied from the nitrogen gas supply pipe 11 into the reaction tube 2, as shown in (c) of FIG. 3. Thus, the gas within the reaction tube 2 is discharged to the outside of the reaction tube 2 (purge/vacuum process).

Subsequently, the chlorine removal step is performed. In the chlorine removal step, first, the internal temperature of the reaction tube 2 is set to a predetermined temperature, for example, 500 degrees C., as shown in (a) of FIG. 3, by the heaters 7. Moreover, the gas is discharged from the reaction tube 2, while a specific amount of nitrogen is supplied from the nitrogen gas supply pipe 11 into the reaction tube 2. Thus, the internal pressure of the reaction tube 2 is set to a predetermined pressure, for example, 133 Pa (1 Torr), as shown in (b) of FIG. 3. Then, a specific amount, for example, 200 sccm of triisopropyl boron ($B(C_3H_7)_3$) as the alkyl metal is supplied from the alkyl metal supply pipe 9 into the reaction tube 2, as shown in (e) of FIG. 3 (flow process).

$B(C_3H_7)_3$ supplied into the reaction tube 2 is heated and activated within the reaction tube 2. For this reason, upon supplying $B(C_3H_7)_3$ into the reaction tube 2, the activated $B(C_3H_7)_3$ severs Si—Cl bonds of the adsorbed Si to remove chlorine from the adsorbed source, as shown in FIG. 4B.

Figure 4B:
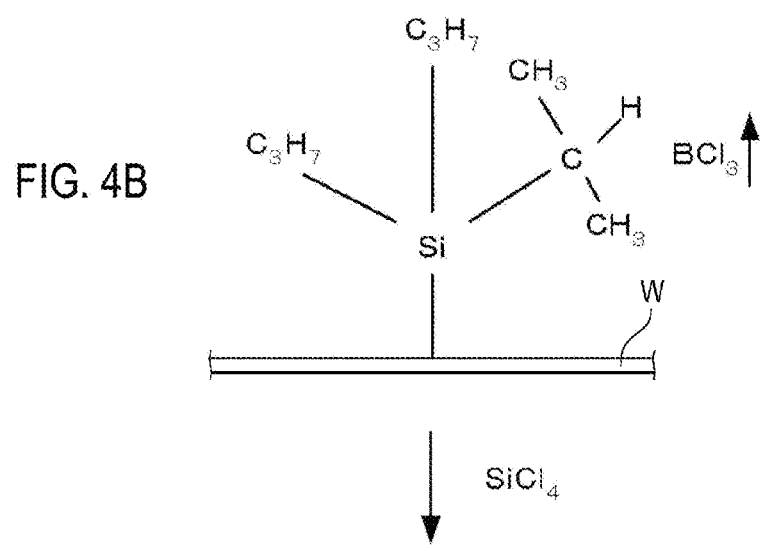

Herein, since triisopropyl boron is used as the alkyl metal, boron changes into $BCl_3$, which has a high vapor pressure, and escapes from the film, as shown in FIG. 4B. $BCl_3$ is unlikely to be left in the SiC film since the $BCl_3$ that is to escape has a higher vapor pressure than that of $AlCl_3$ in the related art. Thus, it is possible to form a SiC film having low impurity content since impurities are unlikely to remain in the film unlike the related art.

When chlorine is removed from the adsorbed source, supply of $B(C_3H_7)_3$ from the alkyl metal supply pipe 9 is stopped. Then, while the gas within the reaction tube 2 is discharged, a specific amount, for example, 500 sccm of nitrogen is supplied from the nitrogen gas supply pipe 11 into the reaction tube 2, as shown in (c) of FIG. 3. Thus, the gas within the reaction tube 2 is discharged to the outside of the reaction tube 2 (purge/vacuum process).

Figure 4C:
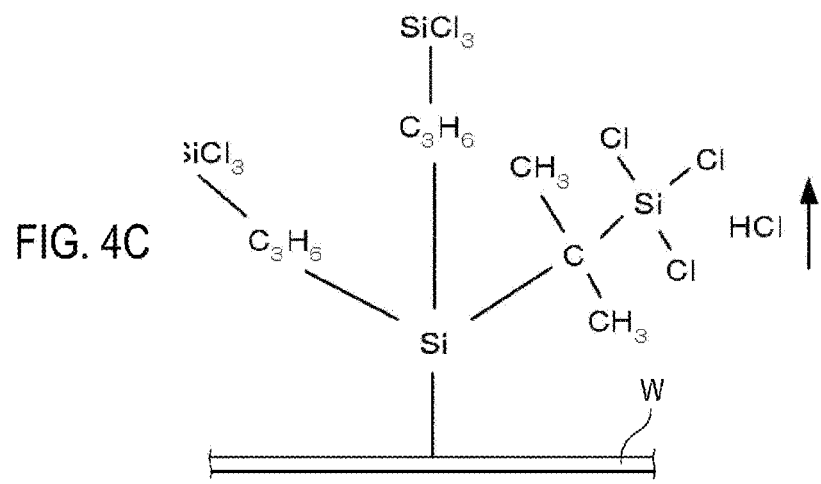

Accordingly, one cycle of the ALD method including the adsorption step and the chlorine removal step is finished. Subsequently, another cycle of the ALD method may be started from the adsorption step, as shown in FIG. 4C, and such a cycle may be repeated a predetermined number of times, for example, one hundred times. In this manner, a SiC film having a desired thickness is formed on the semiconductor wafer W.

When the SiC film having a desired thickness is formed on the semiconductor wafer W, a specific amount of nitrogen is supplied from the nitrogen gas supply pipe 11 into the reaction tube 2, while the interior of the reaction tube 2 is maintained at a predetermined loading temperature, for example, 300 degrees C., by the heaters 7, as shown in (a) of FIG. 3. Thus, the interior of the reaction tube 2 is cycle-purged with nitrogen to be returned to normal pressure (normal pressure restoration process). Then, the lid 5 is moved down by the boat elevator 128, thereby unloading the semiconductor wafers W (unloading process).

As describe above, according to this embodiment, the process in which tetrachlorosilane is adsorbed to the semiconductor wafer W, followed by supplying triisopropyl boron to remove chlorine from the adsorbed source is performed plural times, whereby a SiC film having low impurity content can be formed.

Moreover, the present disclosure is not limited to the aforementioned embodiment but may be modified and applied in many different forms. Hereinafter, other embodiments applicable to the present disclosure will be described.

In the aforementioned embodiment, the present disclosure has been described by way of example performing plural cycles, wherein one cycle is composed of a single adsorption step and a single chlorine removal step. Alternatively, for example, the present disclosure may include plasma treatment step for further removal of chlorine from the SiC film, as shown in FIG. 5. In the plasma treatment step, while the interior of the reaction tube 2 is maintained at a temperature of 500 degrees C. and a pressure of 40 Pa (0.3 Torr), as shown in (a) and (b) of FIG. 5, plasma-activated hydrogen gas ($Ar/H_2$ gas) is supplied into the reaction tube 2, as shown in (f) of FIG. 5 (flow process). A purge/vacuum process in the plasma treatment step is performed under the same condition as the purge/vacuum process in the adsorption step or the chlorine removal step. In this case, the activated hydrogen gas, which is supplied into the reaction tube 2 in the plasma treatment step, can further remove chlorine from the SiC film, thereby forming a SiC film having lower impurity content.

Figure 6:
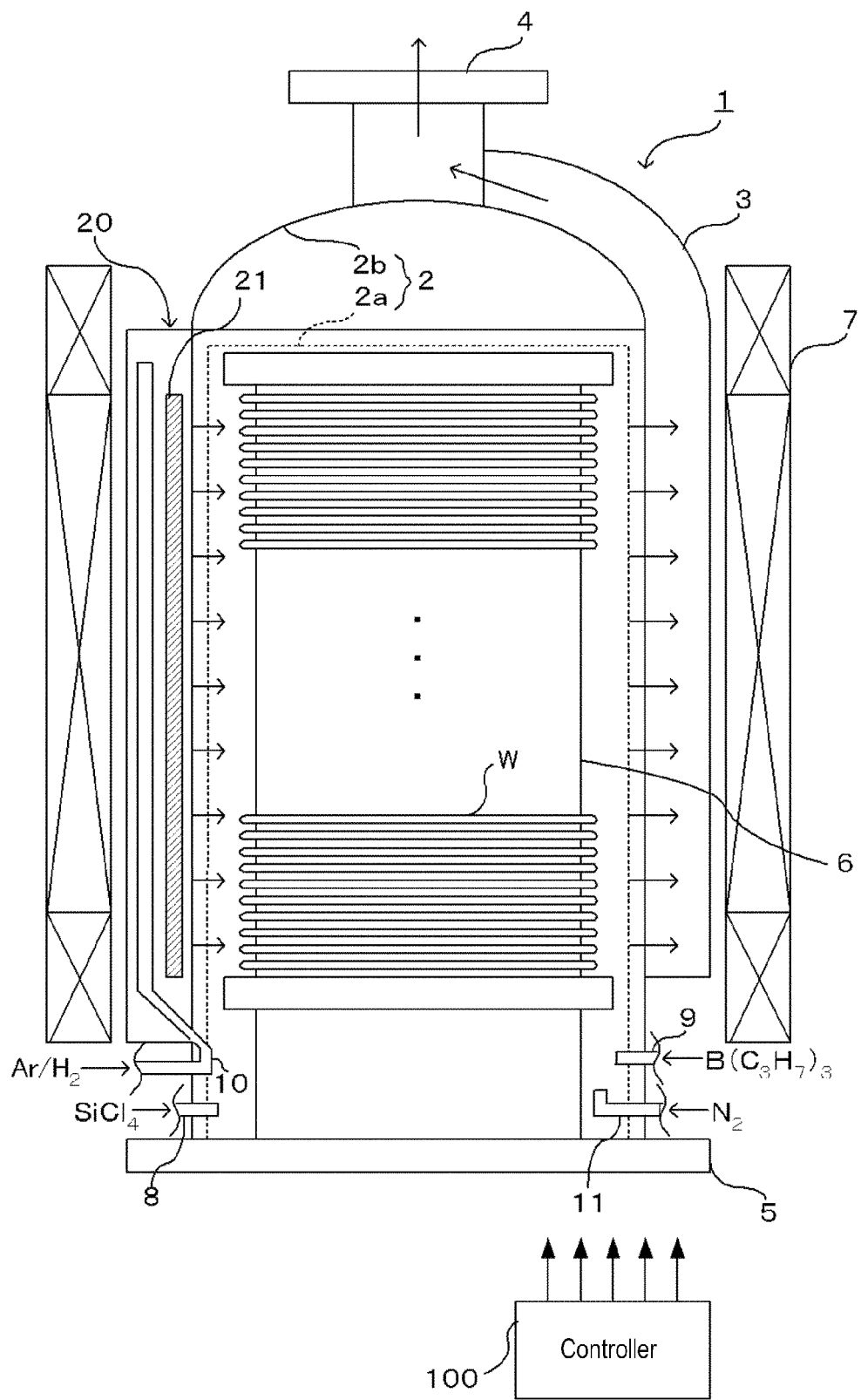
FIG. 6 illustrates a processing apparatus according to another embodiment of the present disclosure.

When such plasma treatment is performed, for example, a processing apparatus 1 as shown in FIG. 6 may be used. The processing apparatus 1 is provided with a plasma generator 20 at the side opposite the side of the reaction tube 2 at which the exhaust unit 3 is disposed. The plasma generator 20 is provided with a pair of electrodes 21, and an $Ar/H_2$ gas supply pipe 10 is inserted into the reaction tube 2 between the pair of electrodes 21. The pair of electrodes 21 is connected to a high frequency power supply, a matching device, and the like (all of which are not shown). Moreover, high frequency power is applied between the pair of electrodes 21 from the high frequency power supply via the matching device, whereby hydrogen gas ($H_2$) supplied between the pair of electrodes 21 is plasma excited (activated) to be supplied into the reaction tube 2 from the plasma generator 20. Alternatively, in order to activate hydrogen gas ($H_2$), catalysts, ultra violet (UV), heat, magnetic force, and the like may be used.

In the aforementioned embodiment, the present disclosure has been described by way of an example wherein the SiC film is intended as a carbon-containing silicon film. However, the carbon-containing silicon film is not limited to the SiC film. The carbon-containing silicon film may be any silicon film including carbon. For example, a carbon-containing silicon oxide film (SiOC film) or a carbon-containing silicon oxynitride film (SiOCN film) may be intended as the carbon-containing silicon film.

Figure 7:
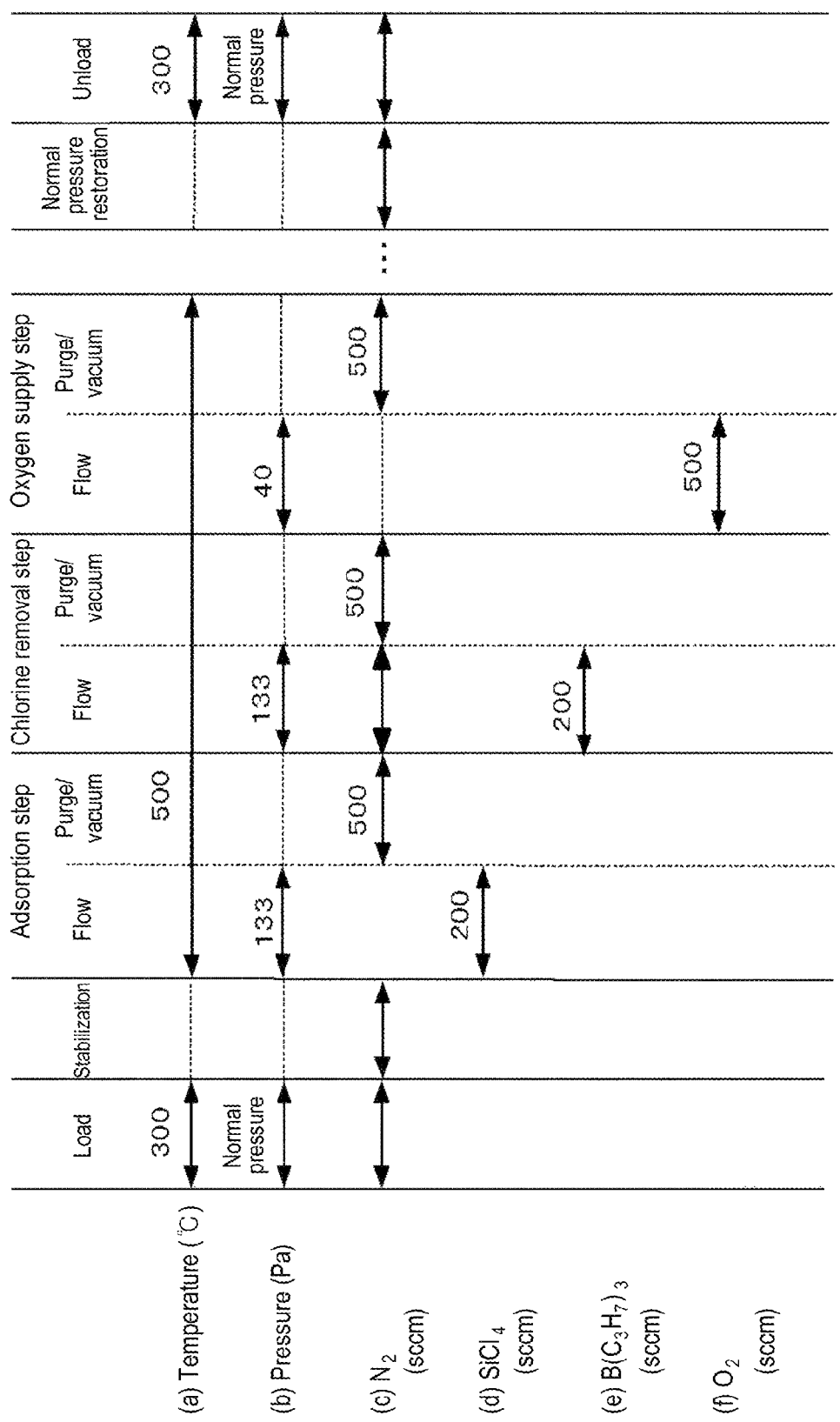
FIG. 7 is a view explaining a method of forming a SiOC film according to the present disclosure.

FIG. 7 illustrates a recipe (time sequence) for explaining a method of forming a SiOC film. In the method of forming a SiOC film, as shown in FIG. 7, a process which includes the adsorption step and the chlorine removal step as describe in the method of forming a SiC film, and further includes an oxygen supply step for supplying oxygen to a SiC film is repeated a predetermined number of times, for example, one hundred times. In the oxygen supply step, after the interior of the reaction tube 2 is maintained at a temperature of 500 degrees C. and a pressure of 40 Pa (0.3 Torr), as shown in (a) and (b) of FIG. 7, 500 sccm of oxygen ($O_2$) is supplied into the reaction tube 2, as shown in (f) of FIG. 7 (flow process). A purge/vacuum process in the oxygen supply step is performed under the same condition as the purge/vacuum process in the adsorption step or the chlorine removal step. Accordingly, oxygen is introduced into a SiC film, thereby forming a SiOC film on the semiconductor wafer W. As such, a carbon-containing silicon film having low impurity content can be formed, since the SiOC film is formed using a SiC film having low impurity content.

Figure 8:
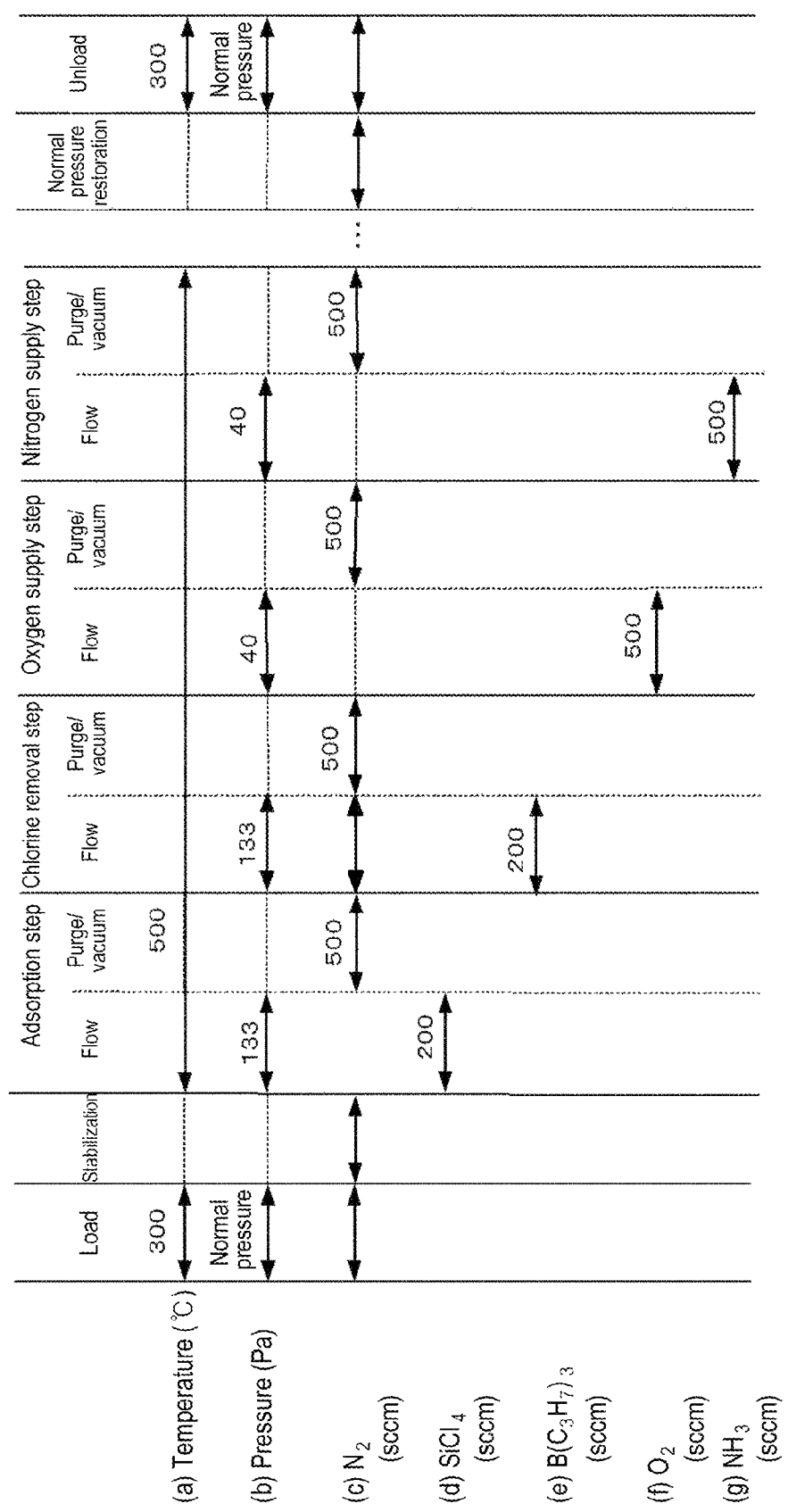
FIG. 8 is a view explaining a method of forming a SiOCN film according to the present disclosure.

FIG. 8 illustrates a recipe (time sequence) for explaining a method of forming a SiOCN film. In the method of forming a SiOCN film, as shown in FIG. 8, a process which includes the adsorption step, the chlorine removal step, and the oxygen supply step as describe in the method of forming a SiOC film, and further includes a nitrogen supply step for supplying nitrogen to a SiOC film is repeated a predetermined number of times, for example, one hundred times. In the nitrogen supply step, while the interior of the reaction tube 2 is maintained at a temperature of 500 degrees C. and a pressure of 40 Pa (0.3 Torr), as shown in (a) and (b) of FIG. 8, 500 sccm of ammonia ($NH_3$) is supplied into the reaction tube 2, as shown in (g) of FIG. 8 (flow process). A purge/vacuum process in the nitrogen supply step is performed under the same condition as the purge/vacuum process in the adsorption step or the chlorine removal step. Accordingly, nitrogen is introduced into a SiOC film, thereby forming a SiOCN film on the semiconductor wafer W. As such, a carbon-containing silicon film having low impurity content can be formed, since the SiOCN film is formed using a SiOC film having low impurity content.

In the aforementioned embodiment, the present disclosure has been described by way of an example wherein tetrachlorosilane is used as the Si source. However, the Si source may be any silicon source containing at least one chlorine group. For example, dichlorosilane ($SiH_2Cl_2$), trichlorosilane ($SiHCl_3$), monochlorosilane ($SiH_3Cl$), hexachlorodisilane ($Si_2Cl_6$), or octachlorotrisilane ($Si_3Cl_8$) may be used as the Si source.

In the aforementioned embodiment, the present disclosure has been described by way of an example wherein triisopropyl boron is used as the alkyl metal. However, the alkyl metal may be any alkyl metal capable of substituting alkyl groups for chlorine of the adsorbed source. For example, trimethyl boron ($B(CH_3)_3$), triethyl boron ($B(C_2H_5)_3$), or tripropyl boron ($B(C_3H_7)_3$) may be used as the alkyl metal. Moreover, corresponding metal may be any metal so long as chloride of the metal has a high vapor pressure, and is not limited to boron.

In the aforementioned embodiment, the present disclosure has been described by way of an example wherein the internal temperature of the reaction tube 2 is set to 500 degrees C. However, the interior of the reaction tube 2 may be set to low temperature by activating a process gas, for example, using catalysts, UV, magnetic force, or the like.

In the aforementioned embodiment, the present disclosure has been described by way of an example performing one hundred cycles, wherein one cycle is composed of a single adsorption step and a single chlorine removal step. As an alternative example, the number of cycles may be reduced to, for example, fifty cycles. Moreover, the number of cycles may be increased to, for example, two hundred cycles. Even in these cases, a SiC film having low impurity density can be formed, for example, by adjusting a feed rate of the Si source and the like.

In the aforementioned embodiment, the present disclosure has been described by way of an example wherein only the process gas is supplied during supply of the process gas. Alternatively, nitrogen may be supplied as the diluting gas during supply of the process gas. In this case, it is easy to set a processing time and the like. The diluting gas may be an inert gas other than nitrogen, for example, helium (He), neon (Ne), argon (Ar), krypton (Kr), or xenon (Xe).

In the aforementioned embodiment, the present disclosure has been described by way of an example wherein the batch-type processing apparatus having a double tube structure is used as the processing apparatus 1. However, as an alternative example, the present disclosure may be applied to a batch-type processing apparatus having a single tube structure. Moreover, the present disclosure may be applied to a batch-type horizontal processing apparatus or a single-substrate-type processing apparatus.

The controller 100 according to the embodiments of the present disclosure may be realized using a typical computer system instead of a dedicated computer system. For example, the controller 100 for performing the aforementioned processes may be configured by installing programs for executing the aforementioned processes into a general-purpose computer through a recording medium (a flexible disk, a compact disc-read only memory (CD-ROM), or the like) which stores the programs.

Moreover, the programs may be provided by arbitrary means. The programs may be provided not only by the recording medium mentioned above but also through a communication line, a communication network, a communication system or the like. In the latter case, the programs may be posted on a bulletin board system (BBS) of the communication network, and provided through a network together. Moreover, it is possible to perform the aforementioned process, by starting and executing the provided program under the control of an operating system (OS) similar to other application programs.

According to the present disclosure, it is possible to provide a method and apparatus for forming a carbon-containing silicon film having low impurity content.

While certain embodiments have been described, these embodiments have been presented by way of example only, and are not intended to limit the scope of the disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method of forming a carbon-containing silicon film, comprising:
    adsorbing a silicon source on a workpiece by supplying a silicon source gas containing at least one chlorine group into a reaction chamber accommodating the workpiece and activating the supplied silicon source gas to react the activated silicon source gas with the workpiece;
    removing chlorine from the adsorbed silicon source containing chlorine by supplying an alkyl metal gas into the reaction chamber and activating the alkyl metal gas to react the activated alkyl metal gas with the adsorbed silicon source; and
    incorporating oxygen into the adsorbed silicon source by supplying oxygen into the reaction chamber and activating the supplied oxygen to react the activated oxygen with the adsorbed silicon source after removing chlorine,
    wherein adsorbing a silicon source, removing chlorine, and incorporating oxygen are sequentially repeated plural times.

2. The method of claim 1, wherein the alkyl metal gas includes trimethyl boron, triethyl boron, tripropyl boron, or triisopropyl boron.

3. The method of claim 1, wherein the silicon source gas includes dichlorosilane, trichlorosilane, monochlorosilane, tetrachlorosilane, hexachlorodisilane, or octachlorotrisilane.

4. The method of claim 1, wherein, in removing chlorine, an internal temperature of the reaction chamber is set to 200 degrees C. to 600 degrees C.

5. The method of claim 1, further comprising plasma-treating configured to further remove chlorine from the adsorbed silicon source containing chlorine by supplying plasma-activated hydrogen gas into the reaction chamber after removing chlorine,
    wherein adsorbing a silicon source, removing chlorine, and plasma-treating are sequentially repeated plural times.

6. The method of claim 1, further comprising: incorporating nitrogen into the adsorbed silicon source by supplying nitrogen into the reaction chamber and activating the supplied nitrogen to react the activated nitrogen with the adsorbed silicon source after incorporating oxygen,
   wherein adsorbing a silicon source, removing chlorine, incorporating oxygen, and incorporating nitrogen are sequentially repeated plural times.

* * * * *